United States Patent
Chang et al.

(10) Patent No.: US 9,711,425 B2
(45) Date of Patent: Jul. 18, 2017

(54) SENSING MODULE AND METHOD FOR FORMING THE SAME

(71) Applicant: XINTEC INC., Taoyuan (TW)

(72) Inventors: Shu-Ming Chang, New Taipei (TW); Po-Chang Huang, New Taipei (TW); Tsang-Yu Liu, Zhubei (TW); Yu-Lung Huang, Taoyuan (TW); Chi-Chang Liao, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/237,287

(22) Filed: Aug. 15, 2016

(65) Prior Publication Data
US 2017/0053848 A1    Feb. 23, 2017

Related U.S. Application Data

(60) Provisional application No. 62/207,377, filed on Aug. 20, 2015.

(51) Int. Cl.
*H01L 23/31* (2006.01)
*G06K 9/00* (2006.01)
*H01L 23/48* (2006.01)

(52) U.S. Cl.
CPC ...... *H01L 23/3121* (2013.01); *G06K 9/00013* (2013.01); *H01L 23/3114* (2013.01); *H01L 23/3178* (2013.01); *H01L 23/481* (2013.01)

(58) Field of Classification Search
CPC ............... H01L 23/3121; H01L 23/481; H01L 23/3178; H01L 23/3114
See application file for complete search history.

(56) References Cited

U.S. PATENT DOCUMENTS

| | | | |
|---|---|---|---|
| 2003/0230798 A1* | 12/2003 | Lin | B81B 7/0064 257/704 |
| 2008/0157330 A1* | 7/2008 | Kroehnert | H01L 21/4871 257/686 |
| 2014/0335658 A1* | 11/2014 | Scanlan | H01L 21/78 438/113 |

FOREIGN PATENT DOCUMENTS

| | | |
|---|---|---|
| TW | 200948052 | 11/2009 |
| TW | 201503334 | 1/2015 |
| TW | 201530668 | 8/2015 |

\* cited by examiner

*Primary Examiner* — Douglas Menz
(74) *Attorney, Agent, or Firm* — Liu & Liu

(57) ABSTRACT

A sensing module is provided. The sensing module includes a sensing device. The sensing device includes a first substrate having a first surface and a second surface opposite thereto. The sensing device also includes a sensing region adjacent to the first surface and a conducting pad on the first surface. The sensing device further includes a redistribution layer on the second surface and electrically connected to the conducting pad. The sensing module also includes a second substrate and a cover plate bonded to the sensing device so that the sensing device is between the second substrate and the cover plate. The conducting pad is electrically connected to the second substrate through the redistribution layer. The sensing module further includes an encapsulating layer filled between the second substrate and the cover plate to surround the sensing device.

22 Claims, 10 Drawing Sheets

SENSING MODULE AND METHOD FOR FORMING THE SAME

CROSS REFERENCE TO RELATED APPLICATIONS

This application claims priority of U.S. Provisional Application No. 62/207,377, filed Aug. 20, 2015, the entirety of which is incorporated by reference herein.

BACKGROUND OF THE INVENTION

Field of the Invention

The invention relates to a sensing module and methods for forming the same, and in particular to a sensing module with a sensing device formed by a wafer-level packaging process.

Description of the Related Art

The chip packaging process is an important step in the fabrication of an electronic product. Chip packages not only protect the chips therein from outer environmental contaminants, but they also provide electrical connection paths between electronic elements inside and those outside of the chip packages. A chip package with sensing function and other electronic components are usually bonded on a circuit board together. As a result, a sensing module is formed. The sensing module is further combined into an electronic product.

However, the conventional processes of a sensing module are complicated and have a low yield. The sensing module is usually recessed from a shell of an electronic product, so it is inconvenient for users to use it. Furthermore, if the sensing chip or chip package is damaged or fails, the whole module cannot work.

Thus, there exists a need to develop a novel sensing module and methods for forming the same, capable of mitigating or eliminating the aforementioned problems.

BRIEF SUMMARY OF THE INVENTION

An embodiment of the invention provides a sensing module. The sensing module includes a sensing device. The sensing device includes a first substrate having a first surface and a second surface opposite thereto. The sensing device also includes a sensing region adjacent to the first surface and a conducting pad on the first surface. The sensing device further includes a redistribution layer on the second surface and electrically connected to the conducting pad. The sensing module also includes a second substrate and a cover plate bonded to the sensing device so that the sensing device is between the second substrate and the cover plate. The conducting pad is electrically connected to the second substrate through the redistribution layer. The sensing module further includes an encapsulating layer filled between the second substrate and the cover plate to surround the sensing device.

An embodiment of the invention provides a method for forming a sensing module. The method includes providing a sensing device. The sensing device includes a first substrate having a first surface and a second surface opposite thereto. The sensing device also includes a sensing region adjacent to the first surface and a conducting pad on the first surface. The sensing device further includes a redistribution layer on the second surface and electrically connected to the conducting pad. The method also includes bonding the sensing device to a second substrate and a cover plate so that the sensing device is between the second substrate and the cover plate. The conducting pad is electrically connected to the second substrate through the redistribution layer. The method further includes forming an encapsulating layer. The encapsulating layer fills between the second substrate and the cover plate to surround the sensing device.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The aforementioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the aforementioned wafer-level packaging process may also be adapted to form a chip package having multilayer integrated circuit devices by stacking a plurality of wafers having integrated circuits or to form a system-in-package (SIP).

Figure 1A:
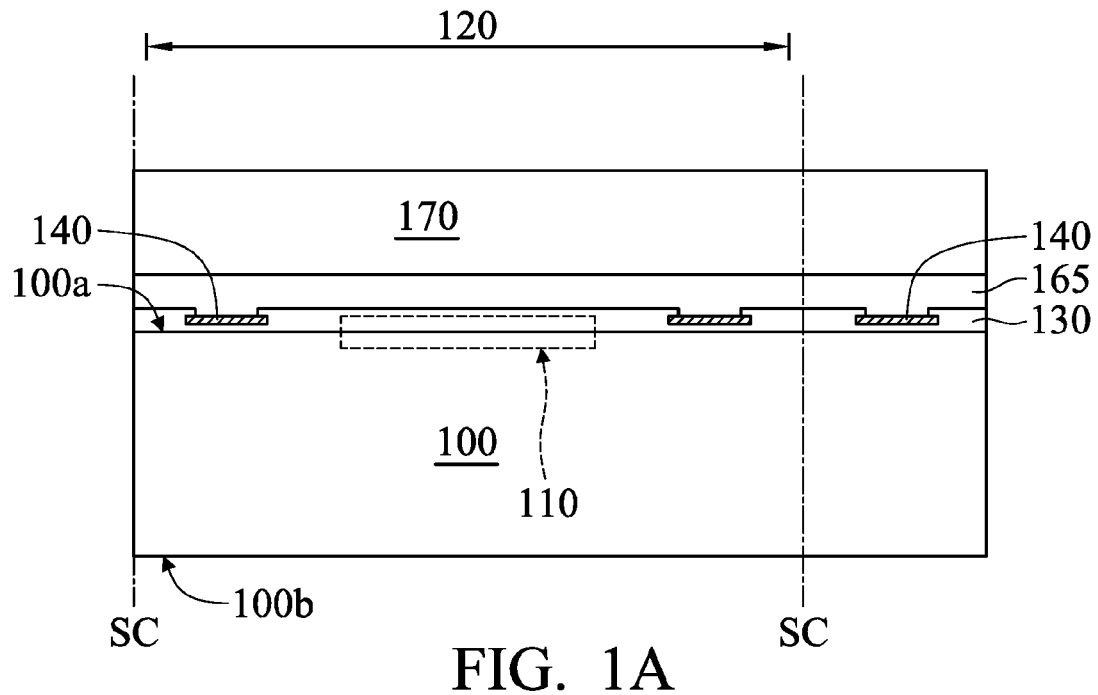
FIGS. 1A to 1G are cross-sectional views of an exemplary embodiment of a method for forming a sensing module according to the invention.
Figure 1B:
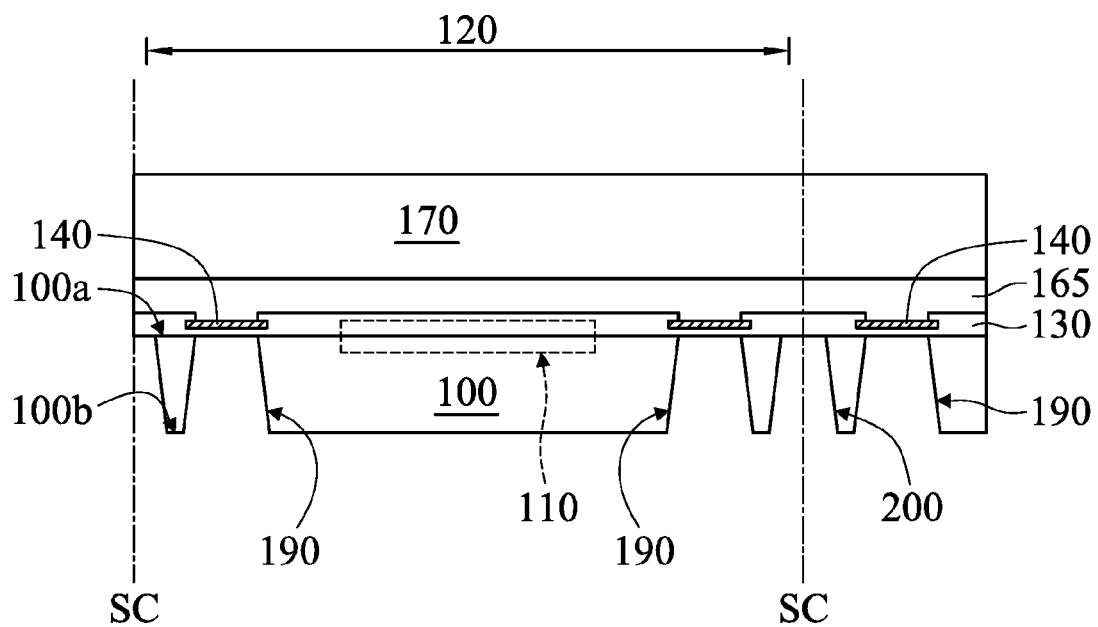
Figure 1C:
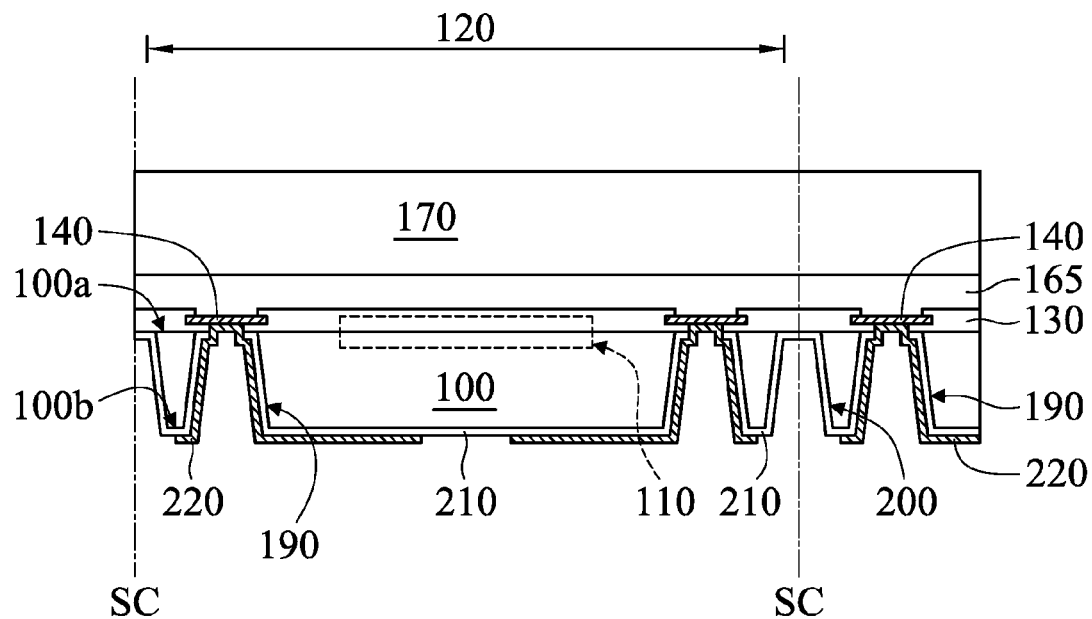
Figure 1D:
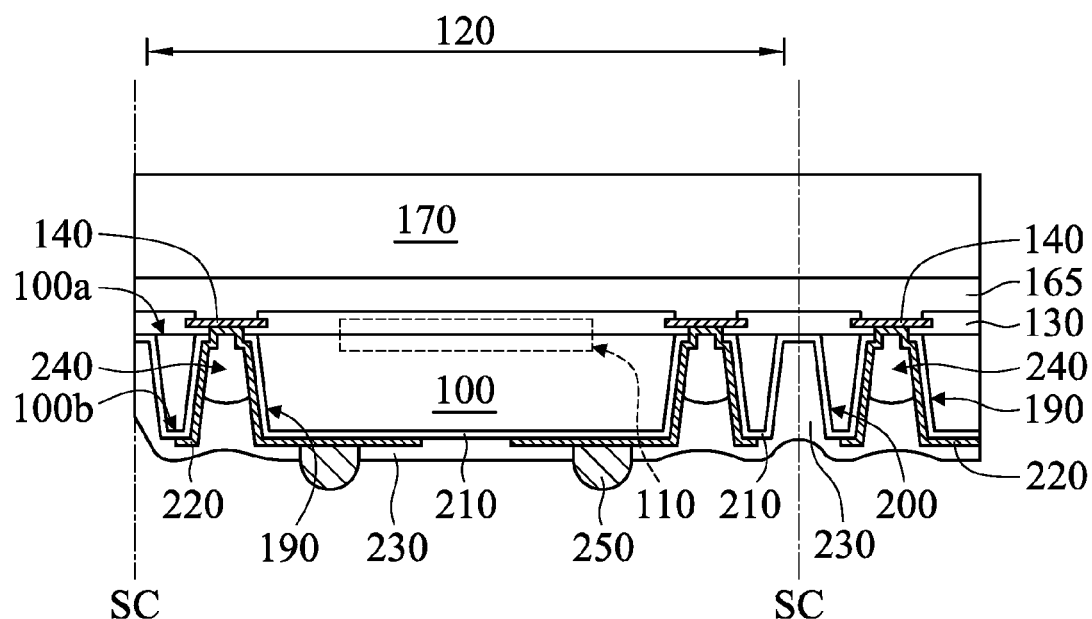
Figure 1E:
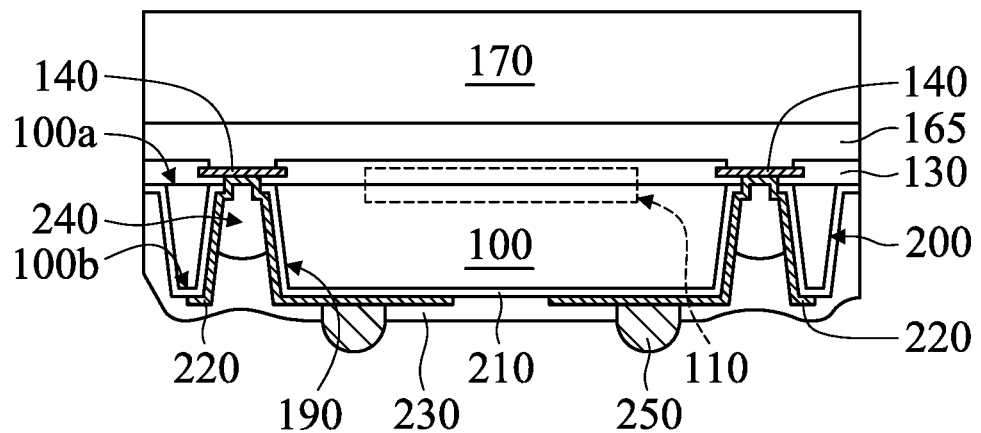
Figure 1F:
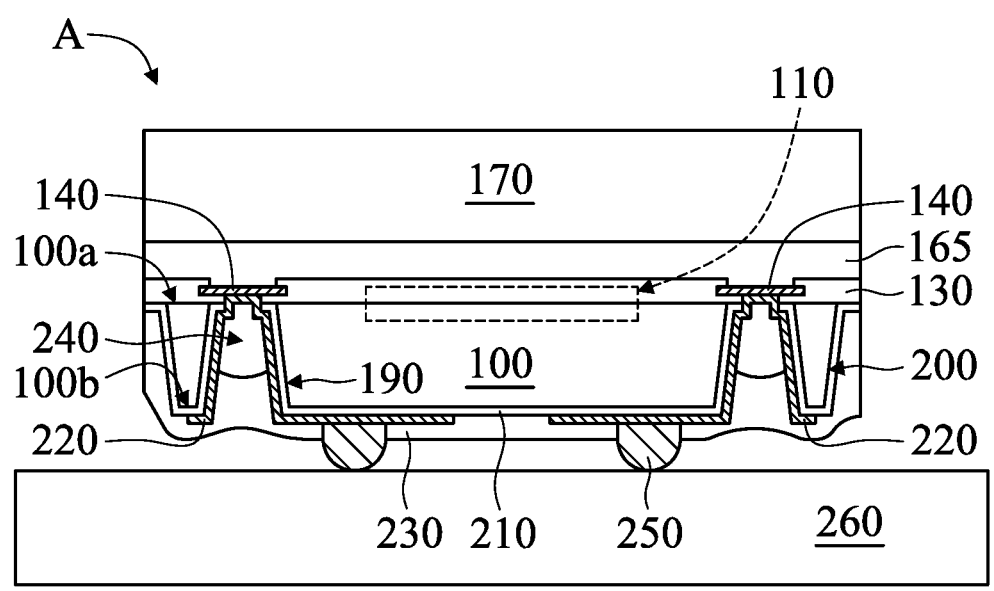
Figure 1G:
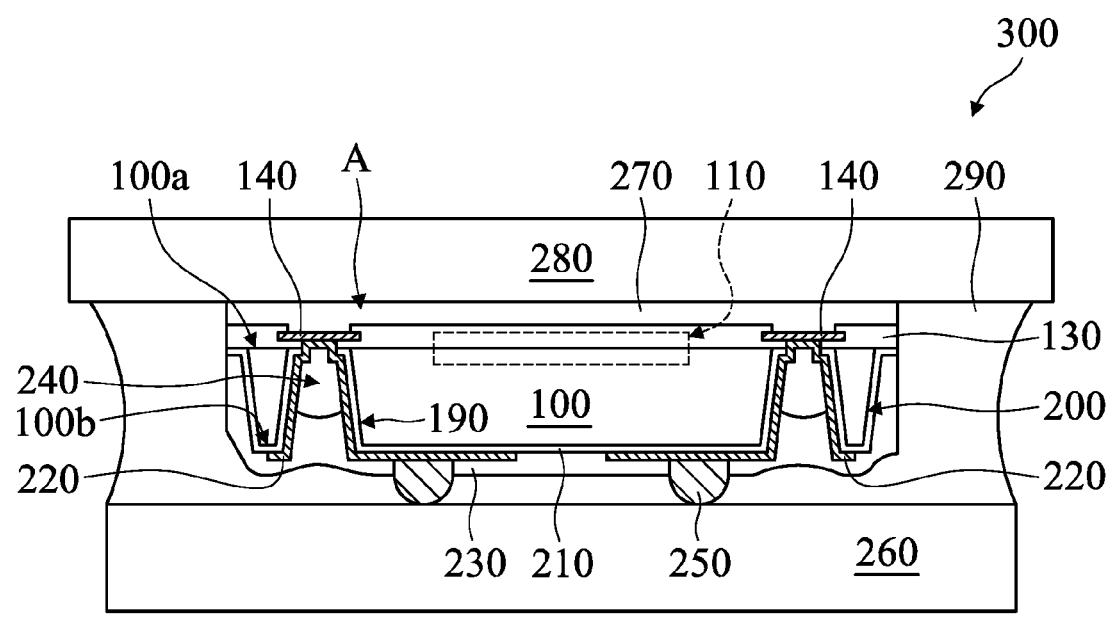
Figure 2:
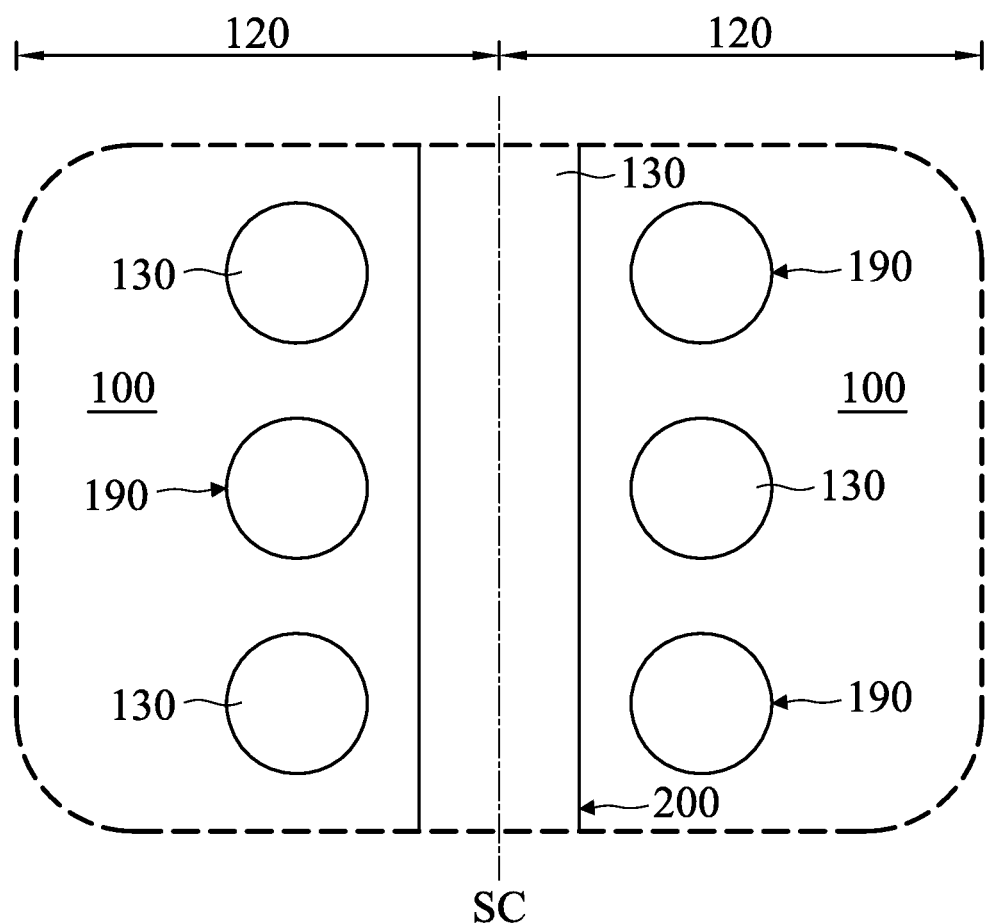
FIG. 2 is a partial top view of an exemplary embodiment of a substrate according to the invention.

An exemplary embodiment of a method for forming a sensing module according to the invention is illustrated in FIGS. 1A to 1G and FIG. 2. FIGS. 1A to 1G are cross-sectional views of an exemplary embodiment of a method for forming a sensing module according to the invention. FIG. 2 is a partial top view of an exemplary embodiment of a substrate according to the invention.

Referring to FIG. 1A, a first substrate 100 is provided. The first substrate 100 has a first surface 100a and a second surface 100b opposite thereto, and comprises multiple chip regions 120. To simplify the diagram, only a complete chip region and a partial chip region adjacent thereto are depicted herein. In some embodiments, the first substrate 100 may be a silicon substrate or another semiconductor substrate. In some other embodiments, the first substrate 100 may be a silicon wafer so as to facilitate the wafer-level packaging process.

There is an insulating layer 130 on the first surface 100a of the first substrate 100. In general, the insulating layer 130 may be made of an interlayer dielectric (ILD) layer, inter-metal dielectric (IMD) layers and a covering passivation layer. To simplify the diagram, only a single insulating layer 130 is depicted herein. In some embodiments, the insulating layer 130 may comprise an inorganic material, such as silicon oxide, silicon nitride, silicon oxynitride, metal oxide, a combination thereof, or another suitable insulating material.

In some embodiments, one or more conducting pads 140 are located in the insulating layer 130 in each of the chip regions 120. In some embodiments, the conducting pads 140 may be a single conducting layer or comprise multiple conducting layers. To simplify the diagram, only two conducting pads 140 comprising a single conducting layer in the insulating layer 130 are depicted herein as an example. In some embodiments, the insulating layer 130 in each of the chip regions 120 comprises one or more openings exposing the corresponding conducting pads 140 so as to perform a pre-test through the exposed conducting pads 140.

In some embodiments, a sensing region 110 is located in each of the chip regions 120. The sensing region 110 may be adjacent to the first surface 100a of the first substrate 100, and may be electrically connected to the conducting pads 140 through interconnection structures (not shown). In some embodiments, the sensing region 110 is configured to sense biometrics. The sensing region 110 may comprise a fingerprint-recognition element (such as a capacitive fingerprint-recognition element). In some other embodiments, the sensing region 110 may comprise a light-sensing element, a temperature-sensing element, a humidity-sensing element, a pressure-sensing element, a capacitance-sensing element, or another suitable sensing element.

In some embodiments, the aforementioned structure may be fabricated by sequentially performing a front-end process and a back-end process of a semiconductor device. For example, the sensing region 110 and integrated circuits may be formed in the first substrate 100 during the front-end process. The insulating layer 130, the interconnection structures, and the conducting pads 140 may be formed on the first substrate 100 during the back-end process. In other words, the following method for forming a sensing device or sensing module proceeds subsequently packaging processes to the aforementioned structure after the back-end process is completed.

Afterwards, a temporary cover plate 170 is bonded to the first substrate 100 by a temporary adhesive layer 165 (such as a removable tape). The temporary cover plate 170 is used to provide support and protection. In some embodiments, the temporary cover plate 170 may comprise glass or another suitable substrate material. The temporary adhesive layer 165 formed between the temporary cover plate 170 and the first substrate 100 completely covers the first surface 100a of the first substrate 100. For example, the temporary adhesive layer 165 covers the conducting pads 140 and the sensing region 110.

Referring to FIG. 1B, a thinning process (such as an etching process, a milling process, a grinding process or a polishing process) using the temporary cover plate 170 as a carrier substrate is performed on the second surface 100b of the first substrate 100. As a result, the thickness of the first substrate 100 is reduced. For example, the thickness of the first substrate 100 may be less than about 100 μm.

Afterwards, multiple first openings 190 and a second opening 200 may be simultaneously formed in the first substrate 100 in each of the chip regions 120 by a lithography process and an etching process (such as a dry etching process, a wet etching process, a plasma etching process, a reactive ion etching process, or another suitable process). The first openings 190 and the second opening 200 expose the insulating layer 130 from the second surface 100b of the first substrate 100. In some other embodiments, the first openings 190 may be formed by a notching process, while the second opening 200 may be formed by lithography and etching processes.

In some embodiments, the first openings 190 correspond to the conducting pads 140 and penetrate the first substrate 100. The diameter of the first openings 190 adjacent to the first surface 100a is less than that of the first openings 190 adjacent to the second surface 100b. Therefore, the first openings 190 have inclined sidewalls. As a result, the difficulty of the process for subsequently forming layers in the first openings 190 are reduced, and reliability is improved. For example, since the diameter of the first openings 190 adjacent to the first surface 100a is less than that of the first openings 190 adjacent to the second surface 100b, layers (such as an insulating layer 210 and a redistribution layer 220) subsequently formed in the first openings 190 can be easily deposited on a corner between the first openings 190 and the insulating layer 130 to avoid affecting electrical connection paths or inducing leakage current problems.

In some embodiments, the second opening 200 extends along the scribe lines SC between the adjacent chip regions 120 and penetrates the first substrate 100, such that the first substrate 100 in each of the chip regions 120 is separated from each other. As shown in FIG. 2, multiple openings 190 in two adjacent chip regions 120 are arranged apart along the second opening 200. The first openings 190 and the second opening 200 are spaced apart from each other by a portion of the first substrate 100 (such as a sidewall portion).

Figure 4:
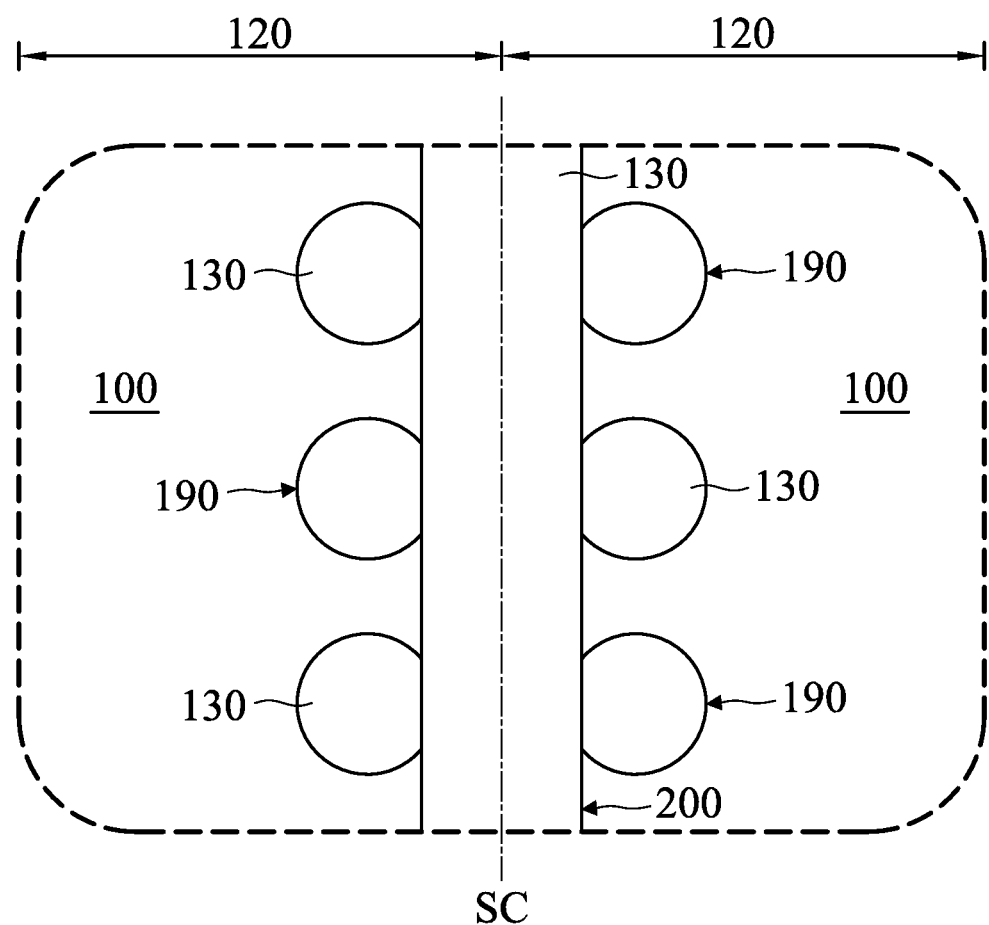
FIG. 4 is a partial top view of another exemplary embodiment of a substrate according to the invention.

In some embodiments, the second opening 200 may extend along the chip regions 120 and surround the first openings 190. In some embodiments, the top-view profile of the first openings 190 is different from that of the second opening 200. For example, the top-view profile of the first openings 190 is circular while the top-view profile of the second opening 200 is rectangular, as shown in FIG. 4. It should be realized that the top-view profiles of the first openings 190 and the second opening 200 may be another shape, and they are not limited thereto.

Referring to FIG. 1C, an insulating layer 210 may be formed on the second surface 100b of the first substrate 100 by a deposition process (such as a coating process, a physical vapor deposition process, a chemical vapor deposition process or another suitable process). The insulating layer 210 fills the first openings 190 and the second opening 200, and is conformally deposited on the sidewalls and the bottoms of the first openings 190 and the second opening 200.

In some embodiments, the insulating layer 210 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or another suitable insulating material.

Afterwards, portions of the insulating layer 210 on the bottom of the first openings 190 and the underlying insulating layer 130 are removed by lithography and etching processes. As a result, the first openings 190 extend further into the insulating layer 130 and expose the corresponding conducting pads 140.

A patterned redistribution layer 220 is formed on the insulating layer 210 by a deposition process (such as a coating process, a physical vapor deposition process, a chemical vapor deposition process, an electroplating process, an electroless plating process or another suitable process) and lithography and etching processes. The redistribution layer 220 conformally extends to the sidewalls and the bottoms of the first openings 190 without extending into the second opening 200. The redistribution layer 220 extends further onto the second surface 100b between the first openings 190 and the second opening 200.

The redistribution layer 220 is electrically isolated from the first substrate 100 by the insulating layer 210. The redistribution layer 220 may be in direct electrical contact with or indirectly electrically connected to the exposed conducting pads 140 through the first openings 190. As a result, the redistribution layer 220 in the first openings 190 is also referred to as a through silicon via (TSV). In some embodiments, the redistribution layer 220 may comprise aluminum, copper, gold, platinum, nickel, tin, a combination thereof, a conductive polymer material, a conductive ceramic material (such as indium tin oxide or indium zinc oxide), or another suitable conductive material.

Referring to FIG. 1D, a protection layer 230 may be formed on the second surface 100b of the first substrate 100 by a deposition process. The protection layer 230 fills the first openings 190 and the second opening 200 to cover the redistribution layer 220. In some embodiments, the protection layer 230 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the first openings 190 are not completely filled with the protection layer 230, so that a hole 240 is formed between the redistribution layer 220 and the protection layer 230 within the first openings 190. Since the protection layer 230 partially fills the first openings 190 and leaves the hole 240, the hole 240 can be a buffer between the redistribution layer 220 and the protection layer 230 in thermal cycles induced in subsequent processes. Undesirable stress, which is induced between the redistribution layer 220 and the protection layer 230 as a result of mismatch of thermal expansion coefficients, is reduced. The redistribution layer 220 is prevented from being excessively pulled by the protection layer 230 when external temperature or pressure dramatically changes. As a result, problems of the redistribution layer 220, which is close to the conducting pad structure, peeling or disconnecting are avoidable. In some embodiments, the interface between the protection layer 230 and the hole 240 has an arcuate contour. In some other embodiments, the first openings 190 may be completely filled with the protection layer 230.

Next, openings may be formed in the protection layer 230 on the second surface 100b of the first substrate 100 by lithography and etching processes so as to expose portions of the redistribution layer 220. Subsequently, conducting structures 250 (such as solder balls, bumps or conductive pillars) may be filled in the openings of the protection layer 230 by a electroplating process, a screen printing process or another suitable process to electrically connect to the exposed redistribution layer 220. In some embodiments, the conducting structures 250 may comprise tin, lead, copper, gold, nickel, or a combination thereof.

After the formation of the conducting structures 250, the protection layer 230, the insulating layer 130, the temporary adhesive layer 165 and the temporary cover plate 170 are diced along the scribe lines SC (equivalent to along the second opening 200), thereby forming multiple separated chip packages (i.e., sensing devices A), as shown in FIG. 1E. For example, a laser cutting process can be performed in order to avoid displacement of upper and lower layers. In some embodiments, the diced first substrate 100 and the diced insulating layer 130 together are referred to as a chip/die.

Referring to FIG. 1F, a second substrate 260 is provided. In some embodiments, the second substrate 260 comprises a circuit board, a ceramic substrate or another suitable substrate material. Afterwards, the sensing device A is bonded onto the second substrate 260. The conducting pads 140 are electrically connected to the second substrate 260 through the redistribution layer 220 and the conducting structures 250 on the second surface 100b of the first substrate 100. For example, the conducting structures 250 may be formed of solder. After the sensing device A is placed on the second substrate 260, a reflow process may be performed so as to bond the sensing device A to the second substrate 260 through solder balls. In some embodiments, the sensing device A has the temporary cover plate 170. Therefore, the sensing device A (especially the sensing region 110) is prevented from being contaminated during the reflow process, thereby improving the quality of the sensing module.

In some embodiments, before the sensing device A is bonded onto the second substrate 260, the required passive elements (such as inductors, capacitors, resistors or other electronic elements) may be formed on the second substrate 260 by surface mount technology (SMT). As a result, the sensing device A is protected from outer environmental contaminants as much as possible. In some other embodiments, the sensing device A and the aforementioned passive elements may be simultaneously bonded onto the second substrate 260 by the same reflow process. Alternatively, after the sensing device A is bonded onto the second substrate 260, the aforementioned passive elements may be formed on the second substrate 260 bonded with the sensing device A by SMT. In this case, since the sensing device A has the temporary cover plate 170, the quality of the sensing module is not negatively affected.

Referring to FIG. 1G, the temporary cover plate 170 and the temporary adhesive layer 165 are removed from the sensing device A. Subsequently, a cover plate 280 is bonded to the sensing device A by an adhesive layer 270. As a result, the sensing device A is between the cover plate 280 and the second substrate 260. In some embodiments, before removing the temporary cover plate 170 and the temporary adhesive layer 165, a test may previously have been performed to the second substrate 260 bonded with the sensing device A. The subsequent packaging processes are only performed to packaging structures of good quality.

In some embodiments, the adhesive layer 270 comprises adhesive glue or another adhesive material. In some embodiments, the adhesive layer 270 between the sensing device A and the cover plate 280 comprises a high dielectric constant (K) material to enhance the sensitivity of the sensing module.

In some embodiments, the cover plate 280 comprises sapphire or another suitable material to further provide an abrasion-resistant, scratch-proof and high-reliability surface, thereby preventing the sensing device from being contaminated or damaged while the sensing functions of the sensing module are being executed. In some other embodiments, the cover plate 280 comprises plastic material or another suitable material. For example, the cover plate 280 may be a plastic holder.

Figure 6:
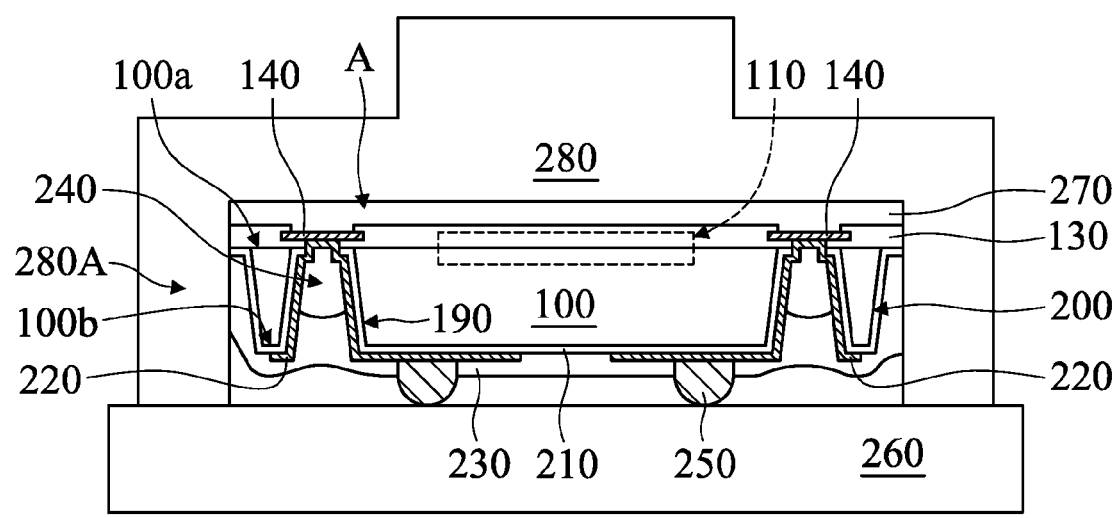
FIG. 6 is a cross-sectional view of some exemplary embodiments of a sensing module according to the invention.

In some embodiments, the size of the cover plate 280 is greater than the size of the sensing device A. Moreover, the size of the cover plate 280 is equal to or greater than the size of the second substrate 260. Therefore, it can be ensure that the sensing module is accommodated in a space in an electronic product. As a result, the sensing module can be combined into the electronic product. In some embodiments, as shown in FIG. 6, the cover plate 280 has an extending portion 280A. The extending portion 280A covers the edge sidewalls of the sensing device A so that the sensing device A is completely or partially embedded in the cover plate 280. In some embodiments, the extending portion 280A is in direct contact with the second substrate 260. In some other embodiments, the extending portion 280A may be not in direct contact with the second substrate 260.

Afterwards, an encapsulating layer 290 may be formed by a dispensing process, a molding process or another suitable process. The encapsulating layer 290 fills into a space surrounded by the cover plate 280 and the second substrate 260. The encapsulating layer 290 is then heat-cured. As a result, a sensing module 300 is fabricated. The encapsulating layer 290 surrounds the sensing device A between the cover plate 280 and the second substrate 260 to protect the sensing device A. In some embodiments, the encapsulating layer 290 further surrounds the adhesive layer 270 and the conducting structures 250 to completely fill the space between the cover plate 280 and the second substrate 260 and between the sensing device A and the second substrate 260.

In some embodiments, the encapsulating layer 290 is made of a material which has high diffusivity and high fluidity and can be heat-cured. In some embodiments, the encapsulating layer 290 comprises underfill material, molding compound material or another suitable material, such as resin.

In some embodiments, a sidewall of the heat-cured encapsulating layer 290 has a curved surface due to a capillary phenomenon. In some embodiments, the encapsulating layer 290 completely covers the upper surface of the second substrate 260 but partially exposes the lower surface of the cover plate 280. In some embodiments, the encapsulating layer 290 completely covers the lower surface of the cover plate 280. In some other embodiments, the encapsulating layer 290 may extend to the sidewall of the second substrate 260. In some embodiments, as shown in FIG. 6, there may be no encapsulating layer 290 between the cover plate 280 and the second substrate 260.

Figure 3:
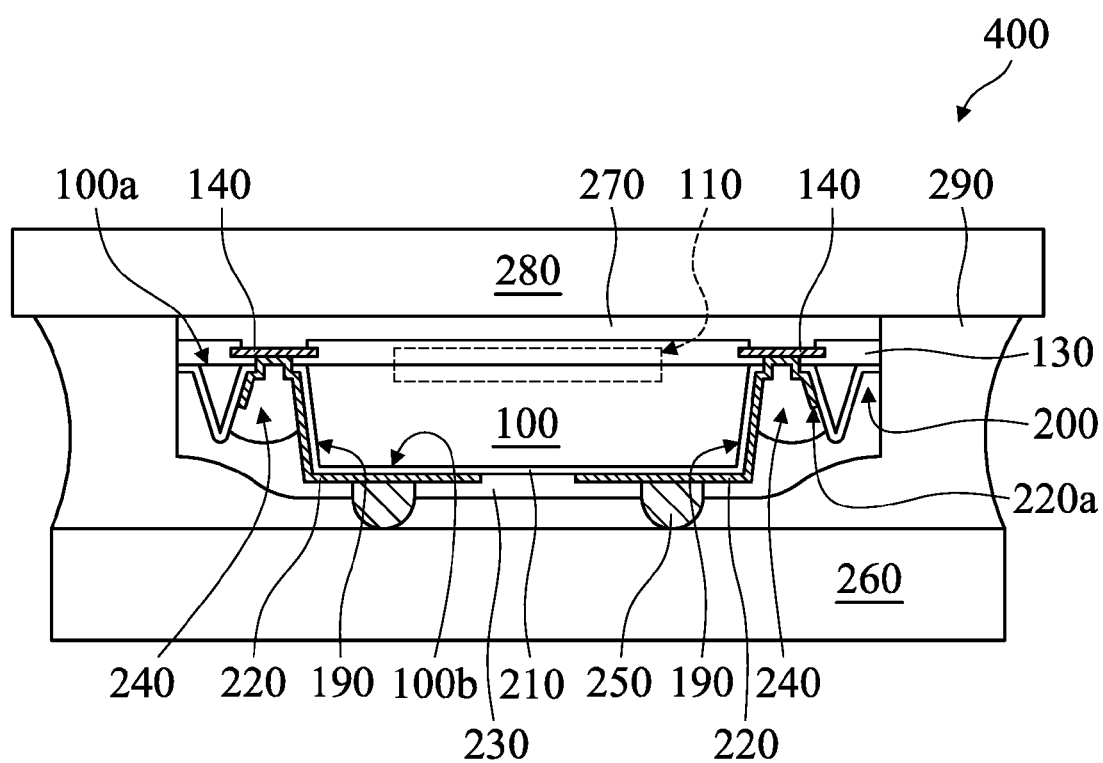
FIG. 3 is a cross-sectional view of another exemplary embodiment of a sensing module according to the invention.

Another exemplary embodiment of a method for forming a sensing module according to the invention is illustrated in FIGS. 3 and 4. FIG. 3 is a cross-sectional view of another exemplary embodiment of a sensing module according to the invention. FIG. 4 is a partial top view of another exemplary embodiment of a substrate according to the invention. Elements in FIGS. 3 and 4 that are the same as those in FIGS. 1A to 1G and FIG. 2 are labeled with the same reference numbers as in FIGS. 1A to 1G and FIG. 2 and are not described again for brevity.

The structure and formation method of a sensing module 400 in FIG. 3 are similar to the structure and formation method of the sensing module 300 in FIG. 1G. The difference therebetween is that the first openings 190 and the second opening 200 in the sensing module 300 are spaced apart and completely isolated from each other through a portion of the first substrate 100 (such as a sidewall portion). In contrast, the first openings 190 and the second opening 200 in the sensing module 400 are in communication with each other. As shown in FIG. 4, a portion of the first openings 190 adjacent to the second surface 100*b* and a portion of the second opening 200 adjacent to the second surface 100*b* are in communication with each other. As a result, the first substrate 100 has a sidewall portion that is lower than the second surface 100*b*. In other words, the thickness of the sidewall portion is less than the thickness of the first substrate 100.

In some embodiments, the sidewalls of the first openings 190 and the second opening 200 are inclined to the first surface 100*a* of the substrate 100. Moreover, an end 220*a* of the redistribution layer 220 in the sensing module 400 extends to a sidewall of one of the first openings 190, rather than extending on the second surface 100*b* of the first substrate 100. For example, the end 220*a* of the redistribution layer 220 is located within the hole 240.

In some embodiments, since the first openings 190 and the second opening 200 are in communication with each other without being completely isolated from each other through a portion of the first substrate 100, it is possible to avoid the buildup of stress in the first substrate 100 between the first openings 190 and the second opening 200. Stress can be mitigated and released through the second opening 200, thereby preventing the sidewall portions of the first substrate 100 from cracking.

Yet another exemplary embodiment of a method for forming a sensing module according to the invention is illustrated in FIGS. 5A to 5D. FIGS. 5A to 5D are cross-sectional views of yet another exemplary embodiment of a method for forming a sensing module according to the invention. Elements in FIGS. 5A to 5D that are the same as those in FIGS. 1A to 1G and FIG. 2 are labeled with the same reference numbers as in FIGS. 1A to 1G and FIG. 2 and are not described again for brevity.

Figure 5A:
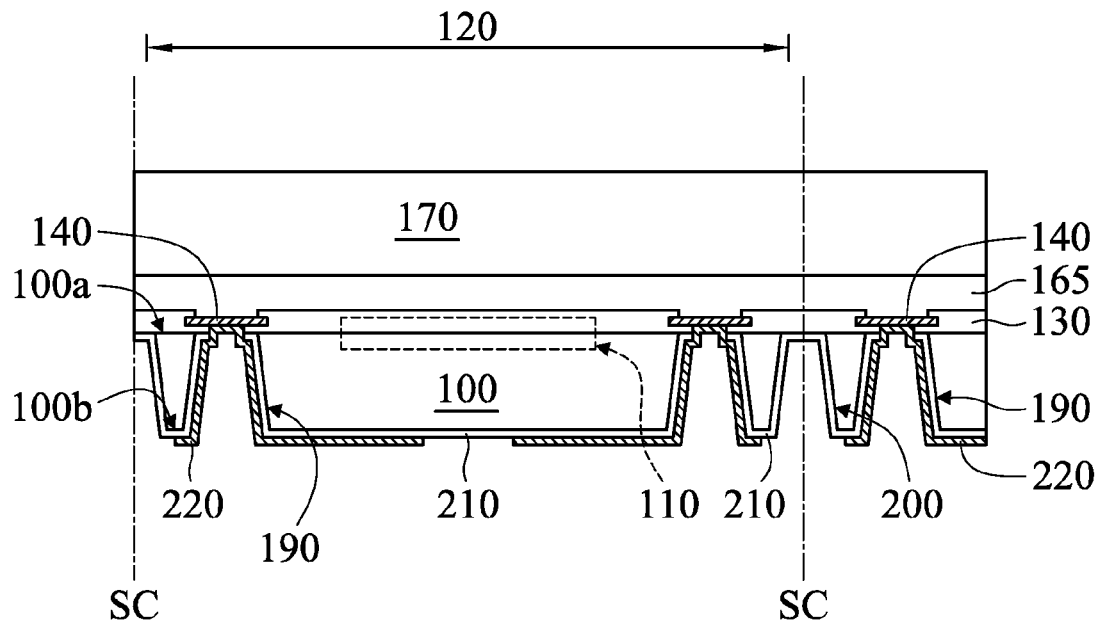
FIGS. 5A to 5D are cross-sectional views of yet another exemplary embodiment of a method for forming a sensing module according to the invention.

Referring to FIG. 5A, the temporary cover plate 170 is bonded to the first substrate 100 through the temporary adhesive layer 165 by steps that are the same as or similar to the steps shown in FIG. 1A. Afterwards, a thinning process is performed to the first substrate 100, and the first openings 190 and the second opening 200 are formed in the first substrate 100 by steps that are the same as or similar to the steps shown in FIG. 1B.

In some embodiments, the first openings 190 and the second opening 200 are spaced apart and completely isolated from each other through a portion of the first substrate 100. In some other embodiments, a portion of the first openings 190 adjacent to the second surface 100b and a portion of the second opening 200 adjacent to the second surface 100b are in communication with each other. As a result, the first substrate 100 has a sidewall portion that is lower than the second surface 100b. Subsequently, the insulating layer 210 and the redistribution layer 220 are formed on the second surface 100b of the first substrate 100 by steps that are the same as or similar to the steps shown in FIG. 1C.

Figure 5B:
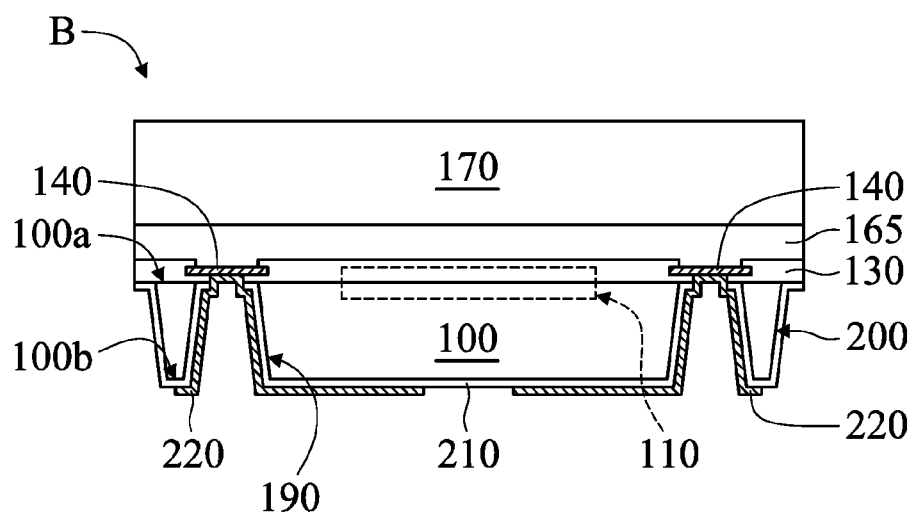

After the formation of the redistribution layer 220, the insulating layer 130, the temporary adhesive layer 165 and the temporary cover plate 170 are diced along the scribe lines SC (equivalent to along the second opening 200), thereby forming multiple separated chip packages (i.e., sensing devices B shown in FIG. 5B). For example, a laser cutting process can be performed in order to avoid displacement of upper and lower layers. In some embodiments, there is no protection layer on the second surface 100b of the first substrate 100. As a result, the redistribution layer 220 is completely exposed. In some other embodiments, a protection layer (such as the protection layer 230) may be optionally formed on the second surface 100b of the first substrate 100.

Figure 5C:
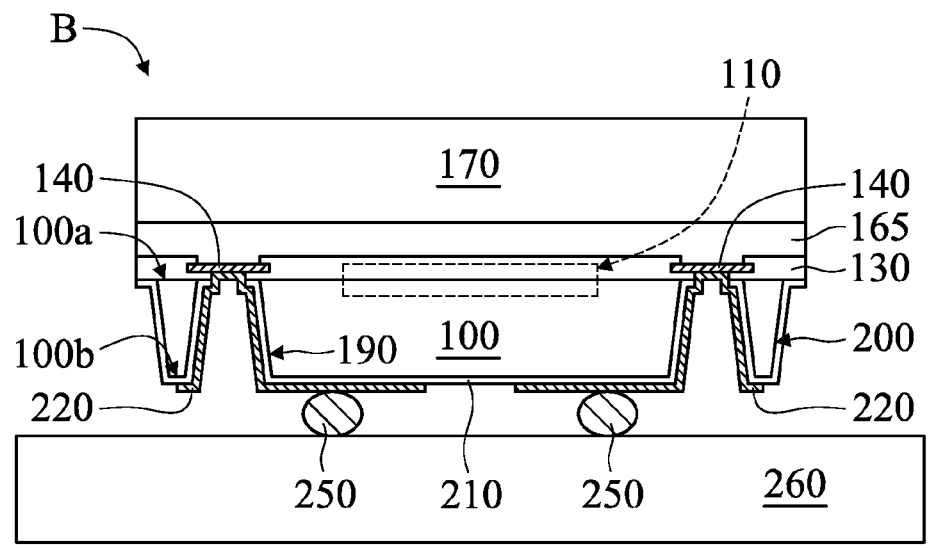

Next, referring to FIG. 5C, the sensing device B is bonded onto the second substrate 260, and is electrically connected to the second substrate 260 through multiple conducting structures 250 between the redistribution layer 220 and the second substrate 260. In some embodiments, the conducting structures 250 are formed using dipping flow technology. For example, the conducting structures 250 made of solder may have been formed previously on the second substrate 260. A reflow process is subsequently performed so as to bond the sensing device B to the second substrate 260 through solder bumps. As a result, the height of the conducting structures 250 can be reduced, thereby facilitating the shrinkage of the overall size of the sensing module.

Furthermore, the sensing device B has an exposed redistribution layer 220. It is advantageous for the sensing device B to successively electrically connect to the conducting structures 250 on the second substrate 260. In some embodiments, the sensing device B has a temporary cover plate 170. Therefore, the sensing region 110 is prevented from being contaminated during the dipping or reflow process, thereby improving the quality of the sensing module.

In some embodiments, the conducting structures 250 comprise conductive glue or another adhesive conductive material so as to attach the sensing device B onto the second substrate 260 and form electrical connection paths by the conducting structures 250. Therefore, the height of the conducting structures 250 can be reduced even further, and there is no need to perform a reflow process which would induce contamination problems. Moreover, before the sensing device B is bonded onto the second substrate 260, the required passive elements (such as inductors, capacitors, resistors or other electronic elements) may be formed on the second substrate 260 by SMT. As a result, the sensing device B is protected from outer environmental contaminants as much as possible.

In some other embodiments, the sensing device B and the aforementioned passive elements may be simultaneously bonded onto the second substrate 260 by the same reflow process. Alternatively, after the sensing device B is bonded onto the second substrate 260, the aforementioned passive elements may be formed on the second substrate 260 bonded with the sensing device B by SMT. In this case, since the sensing device B has the temporary cover plate 170, the quality of the sensing module is not negatively affected.

Figure 5D:
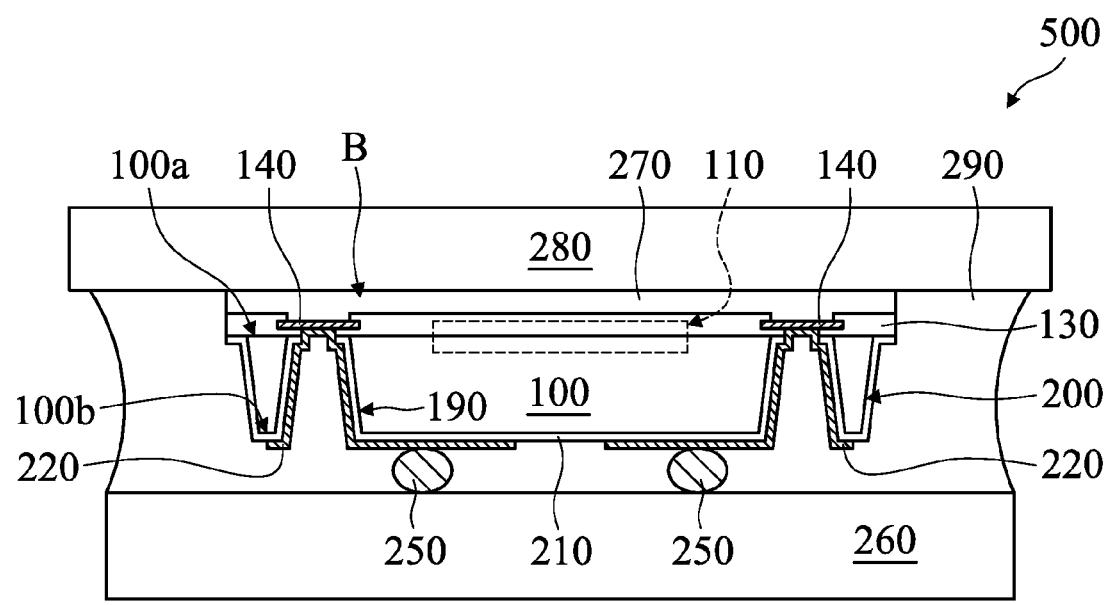

Referring to FIG. 5D, the temporary cover plate 170 and the temporary adhesive layer 165 are removed from the sensing device B. Subsequently, a cover plate 280 is bonded onto the sensing device B by an adhesive layer 270. Afterwards, an encapsulating layer 290 may be formed by a dispensing process, a molding process or another suitable process. The encapsulating layer 290 fills into a space surrounded by the cover plate 280 and the second substrate 260. The encapsulating layer 290 is then heat-cured. As a result, a sensing module 500 is fabricated.

In some embodiments, the encapsulating layer 290 surrounds the sensing device B between the cover plate 280 and the second substrate 260, and further surrounds the adhesive layer 270 and the conducting structures 250. In some embodiments, the encapsulating layer 290 completely fills the space between the cover plate 280 and the second substrate 260 and between the sensing device B and the second substrate 260.

According to the aforementioned embodiments, the fabrication of a sensing module is simple. The sensing device and the required passive elements are incorporated into the same sensing module. In some embodiments, the sensing device is electrically connected to the second substrate through TSVs (i.e., the redistribution layer in the first openings) without performing bonding wire processes to form wires. Accordingly, the fabrication cost is significantly lowered. Furthermore, the size of the sensing module is reduced. It is more advantageous to provide the sensing module with a flat sensing surface.

Moreover, the temporary cover plate is used to provide protection and support during the fabrication of the sensing device. The sensing device can be prevented from being contaminated and negatively affected to its sensing performance. Bending or warpage of the first substrate can also be prevented.

After bonding the sensing device to the second substrate, a pre-test is performed. The subsequent packaging processes (such as removing the temporary cover plate and bonding the high-quality cover plate) are only performed to packaging structures of good quality. Therefore, it can be ensure that the quality of the sensing module is high. The fabrication cost is lowered significantly. In addition, wafer-level chip scale packaging (CSP) technology is used to form sensing devices of sensing modules. Massive sensing devices can be fabricated, thereby reducing the fabrication cost and time further.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sensing module, comprising:
a sensing device, wherein the sensing device comprises:
a first substrate having a first surface and a second surface opposite thereto;
a sensing region adjacent to the first surface;
a conducting pad on the first surface; and
a redistribution layer on the second surface and electrically connected to the conducting pad;
a second substrate and a cover plate bonded to the sensing device so that the sensing device is between the second substrate and the cover plate, wherein the conducting pad is electrically connected to the second substrate through the redistribution layer; and
an encapsulating layer filled between the second substrate and the cover plate to surround the sensing device.

2. The sensing module as claimed in claim 1, wherein the sensing region comprises a biometrics sensing element.

3. The sensing module as claimed in claim 1, wherein the sensing region comprises a fingerprint-recognition element.

4. The sensing module as claimed in claim 1, wherein a size of the cover plate is greater than that of the sensing device.

5. The sensing module as claimed in claim 1, wherein a size of the cover plate is not less than that of the second substrate.

6. The sensing module as claimed in claim 1, wherein the cover plate comprises sapphire or plastic.

7. The sensing module as claimed in claim 1, further comprising an adhesive layer between the cover plate and the sensing device.

8. The sensing module as claimed in claim 7, wherein the adhesive layer comprises a high dielectric constant material.

9. The sensing module as claimed in claim 7, wherein the encapsulating layer further surrounds the adhesive layer.

10. A method for forming a sensing module, comprising:
providing a sensing device, wherein the sensing device comprises:
a first substrate having a first surface and a second surface opposite thereto;
a sensing region adjacent to the first surface;
a conducting pad on the first surface; and
a redistribution layer on the second surface and electrically connected to the conducting pad;
bonding the sensing device to a second substrate and a cover plate so that the sensing device is between the second substrate and the cover plate, wherein the conducting pad is electrically connected to the second substrate through the redistribution layer; and
forming an encapsulating layer, wherein the encapsulating layer fills between the second substrate and the cover plate to surround the sensing device.

11. The method as claimed in claim 10, wherein the sensing device further comprises a temporary cover plate on the first surface to cover the sensing region and the conducting pad, and wherein the method further comprises removing the temporary cover plate after bonding the sensing device to the second substrate and before bonding the sensing device to the cover plate.

12. The method as claimed in claim 10, further comprising forming a conducting structure electrically connected to the conducting pad, wherein the conducting structure is between the redistribution layer and the second substrate.

13. The method as claimed in claim 12, wherein bonding the sensing device to the second substrate comprises performing a reflow process.

14. The method as claimed in claim 12, wherein the conducting structure is formed on the second substrate before bonding the sensing device to the second substrate, and wherein the redistribution layer of the sensing device is exposed after bonding the sensing device to the second substrate and before forming the encapsulating layer.

15. The method as claimed in claim 10, wherein the sensing region comprises a biometrics sensing element.

16. The method as claimed in claim 10, wherein the sensing region comprises a fingerprint-recognition element.

17. The method as claimed in claim 10, wherein a size of the cover plate is greater than that of the sensing device.

18. The method as claimed in claim 10, wherein a size of the cover plate is not less than that of the second substrate.

19. The method as claimed in claim 10, wherein the cover plate comprises sapphire or plastic.

20. The method as claimed in claim 10, wherein the cover plate is bonded to the sensing device through an adhesive layer.

21. The method as claimed in claim 20, wherein the adhesive layer comprises a high dielectric constant material.

22. The method as claimed in claim 20, wherein the encapsulating layer further surrounds the adhesive layer.

* * * * *